US005729613A

United States Patent [19]

Poletti

[11] Patent Number: 5,729,613

[45] Date of Patent: Mar. 17, 1998

[54] REVERBERATORS FOR USE IN WIDE BAND ASSISTED REVERBERATION SYSTEMS

[75] Inventor: Mark Poletti, Wellington, New Zealand

[73] Assignee: Industrial Research Limited, New Zealand

[21] Appl. No.: 624,547

[22] PCT Filed: Oct. 17, 1994

[86] PCT No.: PCT/NZ94/00110

§ 371 Date: Apr. 15, 1996

§ 102(e) Date: Apr. 15, 1996

[87] PCT Pub. No.: WO95/10831

PCT Pub. Date: Apr. 20, 1995

[30] Foreign Application Priority Data

Oct. 15, 1993 [NZ] New Zealand .......................... 248970

[51] Int. Cl.$^6$ .......................... H03G 3/00

[52] U.S. Cl. .......................... 381/63; 84/630

[58] Field of Search .......................... 381/63, 61, 1; 84/630, DIG. 26, 707

[56] References Cited

U.S. PATENT DOCUMENTS

| | | | |
|---|---|---|---|
| 4,338,581 | 7/1982 | Morgan | 84/DIG. 26 |
| 4,366,346 | 12/1982 | Dijkmans et al. | 381/63 |
| 4,803,731 | 2/1989 | Niiui et al. | 381/63 |
| 5,109,419 | 4/1992 | Griesinger . | |
| 5,131,051 | 7/1992 | Kishinaga et al. . | |
| 5,142,586 | 8/1992 | Berkhout . | |
| 5,247,474 | 9/1993 | Kowaki . | |
| 5,297,210 | 3/1994 | Julstrom . | |
| 5,530,762 | 6/1996 | Jones et al. | 381/63 |
| 5,555,306 | 9/1996 | Gerzon | 381/63 |
| 5,621,801 | 4/1997 | Kuwimuto et al. | 381/63 |

FOREIGN PATENT DOCUMENTS

| | | | |
|---|---|---|---|
| 0335468 | 4/1989 | European Pat. Off. . | |
| 0 480 561 | 4/1992 | European Pat. Off. . | |
| 4022217 | 6/1991 | Germany . | |
| 4348399 | 12/1992 | Japan | 381/63 |
| WO 93/23847 | 11/1993 | WIPO . | |

OTHER PUBLICATIONS

Schroeder, M.R., "Improved Quasi-Stereophony and 'Colorless' Artificial Reverberation, "J. Acous. Soc. Am., vol. 33, No. 8, Aug. 1961, pp. 1061-1064.

Moorer, James A., "About This Reverberation Business, "Computer Music Journal, vol. 3, No. 2, pp. 13-28.

Stautner, John; Puckette, Miller, "Designing Multi-Channel Reverberators, "Computer Music Journal vol. 6, No. 1, Spring 1982, pp. 52-65.

Jot, Jean-Marc; Chaigne, Antoine, "Digital delay networks for designing artificial reverberators, "Presented at the 90th Convention Feb. 19-22, 1991, Audio Engineering Society.

(List continued on next page.)

*Primary Examiner*—Curtis Kuntz
*Assistant Examiner*—Xu Mei
*Attorney, Agent, or Firm*—Woodard, Emhardt, Naughton, Moriarty & McNett

[57] ABSTRACT

A multi-channel reverberation system has a substantially constant multi-channel power gain at audio frequencies and comprises multiple signal inputs, one for each input channel, a number of comb filter networks connected to each signal input, each comb filter network including a feed forward stage, a cross-coupling network cross-coupling the comb filters to increase the reverberation echo density, and multiple signal outputs, one for each output channel. Preferably the feed forward stage of each comb filter provides a substantially constant multi-channel power gain at audio frequencies and the cross-coupling matrix is an orthogonal cross-coupling matrix cross-coupling a number of single channel allpass comb filters, positioned immediately before or after the delay lines, to create a multi-channel allpass comb filter with a unitary transfer function matrix at all frequencies.

3 Claims, 4 Drawing Sheets

OTHER PUBLICATIONS

Parkin, P.H. & Morgan, K., "Assisted Resonance in the Royal Festival Hall, London: 1965–1969, "Journal of the Acoustical Society of America, Apr. 28, 1970, pp. 1025–1035.

DeKoning, S.H., "The MCR System—Multiple–Channel Amplification of Reverberation, "Philips Tech, Rev. 41. No. 1, 1983/84, pp. 12–25.

Kawakami, F. & Shimizu, Y., "Active Field Control in Auditoria, "Applied Accoustics 31 (1990) , pp. 47–75.

Jones, M.H. & Fowweather, f., "Reverberation Reinforcement—an Electro–Acoustical System for Increasing the Reverberation Time of an Auditorium, "Acoustica, vol. 27 (1972) , pp. 357–363.

Prinssen, Ir. W.C.J.M. & Holden, M., "System for Improved Acoustic Performance (SIAP) , "Proc. I.O.A. vol. 14, Part 2 (1992) pp. 93–101.

Griesinger, David, "Improving Room Acoustics Through Time–Variant Synthetic Reverberation, "90th Convention Audio Engineering Society, Feb. 19–22, 1991.

Berkhout, A.J., DeVries, D., & Vogel, P., "Acoustic Control by Wave Field Synthesis, "J. Acoust. Soc. Am. 93 (5), May 1993, pp. 2764–2778.

REVERBERATORS FOR USE IN WIDE BAND ASSISTED REVERBERATION SYSTEMS

TECHNICAL FIELD

The invention relates to assisted reverberation systems and PA or speech reinforcement systems that utilise reverberation devices.

BACKGROUND ART

Public address and speech reinforcement systems are used to amplify and broadcast voice signals. In these systems, microphones are placed close to the performers and the microphone signals are amplified, processed and fed to amplifiers and loudspeakers for broadcasting. In such systems, the loudspeaker signals couple back to the microphones, and if the gain is too high, the system can become unstable. This feedback between the loudspeakers and microphones is minimised by using directional microphones and having the microphones close to the performers to maximise the signal level.

An assisted reverberation system is used to improve and control the acoustics of a concert hall (auditorium). There are two fundamental types. The first is the in-line system, in which the direct sound produced on stage by the performer (s) is picked up by microphone(s), processed by feeding it through delays, filters and reverberators, and broadcast into the auditorium from several loudspeakers which may be at the front of the hall or distributed around the walls and ceiling. In an in-line system acoustic feedback (via the auditorium) between the loudspeakers and microphones is not required for the system to work (hence the term in-line). The PA and speech reinforcement systems described above are simple examples of in line systems.

The second type of assisted reverberation system is the non-in-line system in which a number of microphones pick up the reverberant sound in the auditorium and broadcast it back into the auditorium via filters, amplifiers and loudspeakers (and in some variants of the system, via delays and reverberators—see below). The rebroadcast sound is added to the original sound in the auditorium, and the resulting sound is again picked up by the microphones and rebroadcast, and so on. The non-in-line system thus relies on the acoustic feedback between the loudspeakers and microphones for its operation (hence the term non-in-line).

In turn, there are two basic types of non-in-line assisted reverberation system. The first is a narrowband system, where the filter between the microphone and loudspeaker has a narrow bandwidth. This means that the channel is only assisting the reverberation in the auditorium over the narrow frequency range within the filter bandwidth. An example of a narrowband system is the Assisted Resonance system, developed by Parkin and Morgan [1] and used in the Royal Festival Hall in London. The advantage of such a system is that the loop gain may be relatively high without causing difficulties due to instability. A disadvantage is that a separate channel is required for each frequency range where assistance is required.

The second form of non-in-line assisted reverberation system is the wideband system, where each channel has an operating frequency range which covers all or most of the audio range. In such a system the loop gains must be low, because the stability of a wideband system with high loop gains is difficult to maintain. An example of such a system is the Philips MCR ('Multiple Channel amplification of Reverberation') system [2,3], which is installed in several concert halls around the world, such as the POC Congress Centre in Eindhoven. It has been shown [3] that the power gain due to the MCR system is given by $$P_{MCR} = \frac{1}{1 - \alpha_{MCR}^2 N} \quad (1)$$

where $\alpha_{MCR}$ is the loop gain and N is the number of microphone, loudspeaker channels. The reverberation time is increased by the same factor.

An improved wideband non-in-line assisted reverberation system has been described in Pct Patent application NZ93/00041[4–6]. In this system (FIG. 1) N microphones pick up the sound in the primary room and the microphone signals are fed into a secondary room and are reverberated and scaled by the loop gain before being fed back into the primary room. In practice the secondary room is replaced with a reverberation matrix. This improved system allows the apparent volume in the primary room to be altered independently of the apparent absorption. The improved system shall be denoted VRA (Variable Room Acoustics). The power gain introduced by the system is given by $$P_{VRA} = \frac{1}{1 - \alpha_{VRA}^2 N} \quad (2)$$

where $\alpha_{VRA}$ is the loop gain. The expression contains the square of the number of channels N, compared with N in the MCR system. This is due to the fact that the primary and secondary rooms have an effective power gain of N. Both systems thus have the same mean power gain for $$\alpha_{VRA} = \frac{\alpha_{MCR}}{\sqrt{N}} \quad (3)$$

The Philips system provides a reverberation time boost which is equal to the power gain. As a result, the reverberation boost is limited by the maximum attainable power gain before instability. The VRA system, however, allows the reverberation time to be boosted over and above the power gain increase by controlling the reverberation time of the secondary room (while holding its gain constant). It has been shown [6] that the VRA system gives a reverberation time boost of $$\frac{T_{ass}}{T_1} = \frac{\beta}{\left(\frac{1+\beta}{2}\right) - \sqrt{\left(\frac{\beta-1}{2}\right)^2 + \beta\alpha_{VRA}^2 N^2}} \quad (4)$$

where $T_{ass}$ is the assisted reverberation time, $T_1$ is the unassisted reverberation time in the primary room and β is the ratio of the secondary room to primary room reverberation time. The gain in RT is equal to the power gain (equation 2) for β=0, (the equivalent MCR case), and it rises monotonically from that value as β increases.

The main difficulty with non-in-line systems is that they can become unstable, due to the feedback between the microphones and loudspeakers. The problem is minimised by using a large number of channels and keeping the loop gain in each channel low. For example the Philips system typically uses between 60 and 100 channels. However, even with large numbers of channels and low loop gains the sound in the hall can sound 'coloured'. In a natural room, the sound decay at any position in the room consists of the sum of an infinite number of room modes. Typically all of these room modes have the same or similar decay rates, and as a result the decay in dB is linear [7]. In a non-in-line assisted reverberation system, this similarity of decay rates is reduced. As a result, some room modes have longer decay rates, and after a certain time those room modes with the longest decay times dominate the sound of the decay. The decay is perceived as containing one or more 'ringing tones', or being 'coloured'. Those modes which produce ringing tones occur at frequencies where the loop gain through the system is high and where the phase is a multiple of 2 π. The feedback at such frequencies is thus positive.

In-line systems attempt to minimise the feedback between loudspeakers and microphones, but the problem is never eliminated completely. Thus, the problem of colouration also occurs in in-line systems.

The improved non-in-line VRA system described in PCT patent application NZ93/00041 provides an increase in the reverberation time over previous systems for the same loop gain. However, the loop gain in the system is more complex, due to the fluctuating frequency response of the secondary room matfix. As a result, the improved system will produce a higher degree of colouration than the MCR system for the same loop gain (equation 3). It would therefore be desirable to design a reverberation matrix that has a low degree of fluctuation in its frequency response.

In the same manner, an in-line system that utilises a reverberator will have a greater propensity to become unstable since the reverberator produces a fluctuating loop gain that at some frequencies is higher than the loop gain without the reverberator. Again, a reverberator with a lower degree of fluctuation in its frequency response will reduce the problem.

In the ease of a single microphone, reverberator and loudspeaker it is obvious that a low degree of fluctuation requires that the reverberator have a constant magnitude at all frequencies, ie it is allpass. Most reverberator structures do not produce such a response, however, since they consist of a parallel connection of comb filters [8]. Allpass comb filter sections are often used following these parallel connections of comb filters to increase the echo density[8,9]; however, it is not likely that a series connection of allpass comb filters alone would produce a reasonable reverberation because the configuration does not simulate a simple sum of decaying exponential modes as occurs in a room.

In the multidimensional case the definition of 'low fluctuation' is more complicated since the reverberation matrix contains $N^2$ transfer functions and each output is the sum of N input signals transmitted through N transfer functions.

DISCLOSURE OF INVENTION

The present invention provides a class of multichannel reverberator which produces a low degree of fluctuation in a multidimensional sense. The class of reverberator allows the VRA system to produce identical or at least similar colouration performance to the MCR system for the same power gain. It also allows the colouration in in-line systems and PA/speech reinforcement systems to be reduced.

In broad terms the invention comprises:

multiple signal inputs, one for each input channel, a number of comb filter networks connected one to each signal input, each comb filter network including a feed forward stage, a cross-coupling network cross-coupling the comb filters to increase the reverberation echo density, and multiple signal outputs, one for each output channel.

BRIEF DESCRIPTION OF DRAWINGS

The invention will now be further described with reference to the accompanying drawings, by way of example and without intending to be limiting. In the drawings.

DETAILED DESCRIPTION

Power Gain in Multichannel Linear Systems

Figure 1:
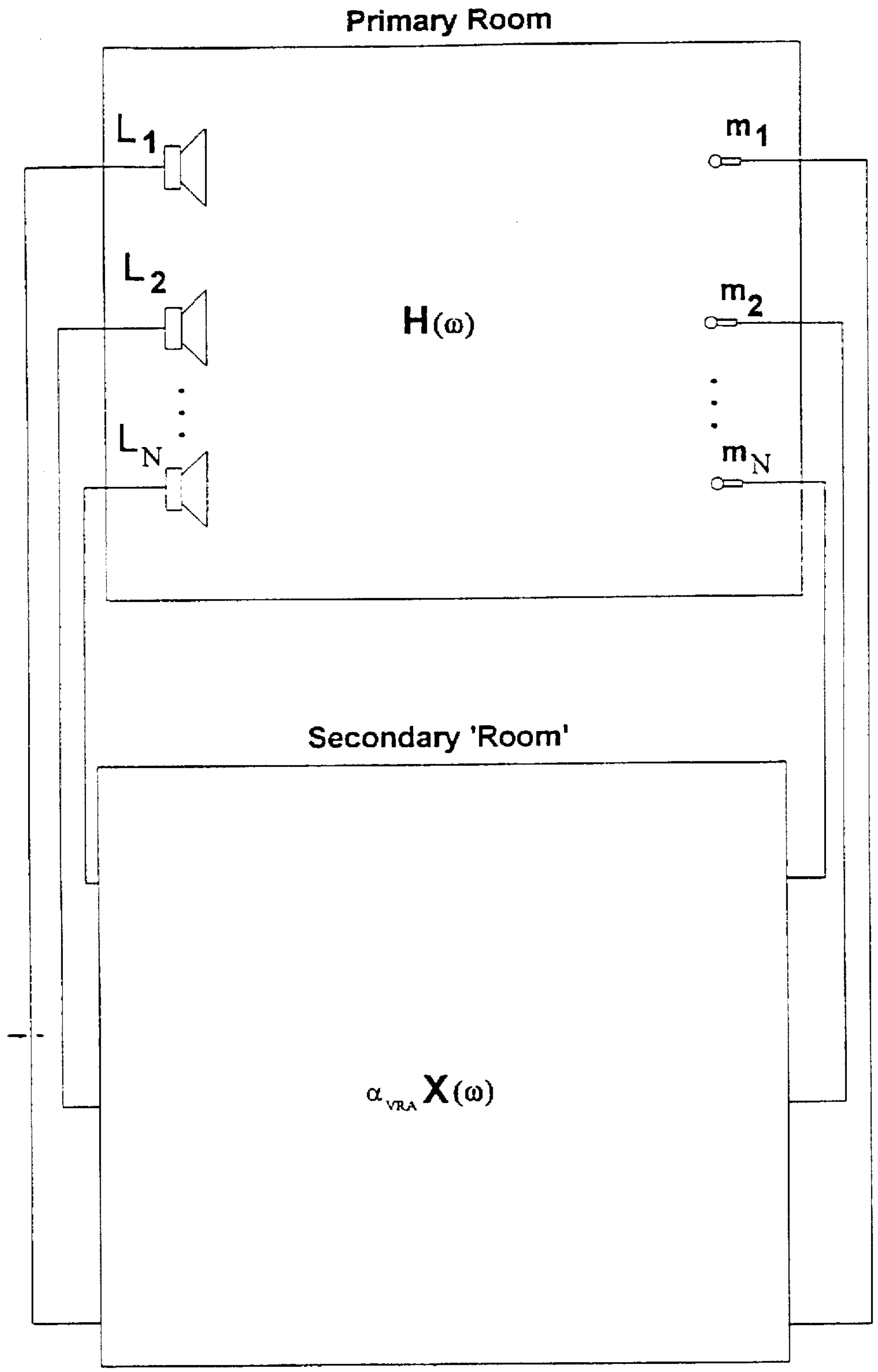
FIG. 1 shows a VRA assisted reverberation system.

Consider an N channel system X(ω) which is excited with unit mean power white noise bandlimited to B Hz at all inputs. If the input signals are all uncorrelated, it can be shown that the mean power output is given by $$P_{out} = \frac{1}{2B} \int_{-B}^{B} \|X(\omega)\|^2 d\omega \quad (5)$$

where the integrand is the (Frobenius) norm squared of the transfer function matrix at frequency ω. Thus the power gain, $P_{out}/N$, is governed by the avenge squared norm. In order to study the power gain of the system at a single frequency, we consider exciting the system with a vector signal consisting of unit power complex sinusoids at all N inputs; $s(t)=\exp(j\omega_0 t)u$, where $$u=[e^{j\phi_1}, e^{j\phi_2}, \ldots, e^{j\phi_N}]^T \quad (6)$$

If the phases of the sinusoids are samples from an underlying probability distribution $P(\phi_1, \phi_2, \ldots \phi_N)$ in which the phase random variables are independent then it can be shown that the sum of the variances at the N outputs is given by $$\sigma^2=\|X(\omega_0)\|^2 \quad (7)$$

Thus the squared norm of X(ω) divided by N is the 'phase avenged' power gain. This function allows a definition of 'low fluctuation' of the response of an N channel system. An ideal multichannel reverberator for use in a non-in-line assisted reverberation system will have a constant norm for all frequencies. In the multichannel case, such a reverberator may be loosely termed Allpass.

Unitary Systems

Consider a matrix X which is unitary, ie $$X^{\dagger}X=I \quad (8)$$

where † denotes the conjugate transpose. The rows (and columns) of X are thus orthonormal vectors. The norm squared of X is given by $$\|X\|^2 = \sum_{k=1}^{N} [X^{\dagger}X]_{kk} = \sum_{k=1}^{N} I_{kk} = N \quad (9)$$

Hence any unitary matrix has a norm squared equal to the matrix dimension. The wideband or phase averaged power gain is thus equal to one. It will now be shown that for the unitary case the power gain is also one for constant sinusoids at one frequency applied to all inputs. Suppose the matrix X represents the value of a transfer function at frequency $\omega_0$. The vector response y(t) to the input vector s(t) is given by $y(t)=\exp(j\omega_0 t)Xu$ (see equation 6) and the total power in the output is $$y(t)^{\dagger}y(t)=u^{\dagger}X^{\dagger}Xu=u^{\dagger}u=N \quad (10)$$

where the time dependence cancels. Thus the output power is equal to N for constant sinusoidal excitation and is independent of the input phases. The power gain is thus unity at all frequencies. Hence: A linear multichannel system may be termed unitary if its transfer function matrix is unitary at all frequencies. A unitary system has a constant norm and unit power gain for all frequencies.

A unitary system is ideal for use in the VRA system since it has the same power gain at all frequencies and thus will not increase the colouration. It may also be inserted into an MCR system without altering the loop gain. The power gain of the VRA system with a unitary reverberator is given by $$P_{VRA}|_{unitary}=\frac{1}{1-\alpha_{VRA}^2N} \quad (11)$$

which equals $P_{MCR}$ for $\alpha_{VRA}=\alpha_{MCR}$.

Figure 2:
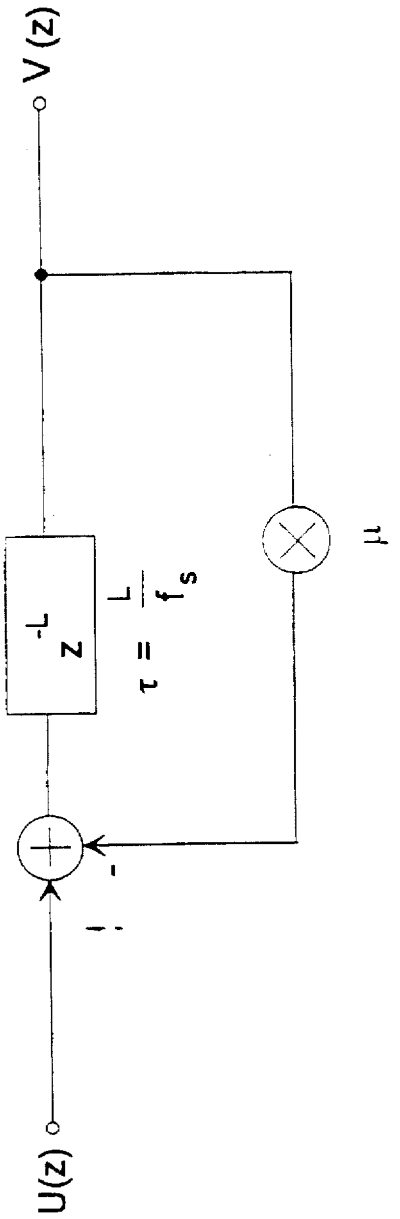
FIG. 2 shows a single channel comb filter which is the basis for many conventional digital reverberators.

Most digital reverberators are based on the comb filter, shown in FIG. 2 [8–10]. This circuit produces an impulse response that is an exponentially decaying sequence of delta functions occuring at multiples of the delay time $\tau=L/f_s$ where $f_s$ is the sample rate. The output may be taken from the summer, the delay or the multiplier outputs. The transfer function for the comb filter with output taken from the delay output is $$X(z)=\frac{z^{-L}}{1+\mu z^{-L}} \quad (12)$$

Figure 3:
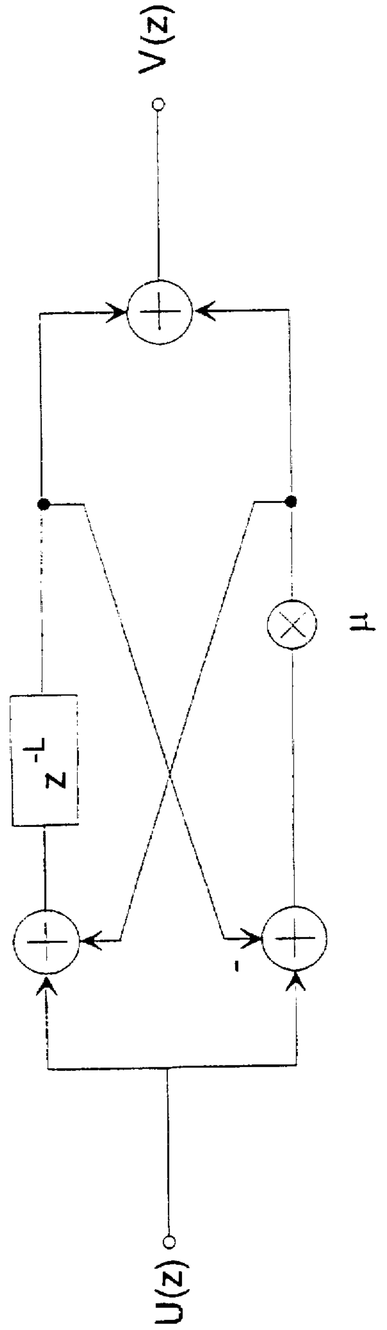
FIG. 3 shows a single channel all pass comb filter which is the basis for the reverberation system of the invention.

The single channel comb filter can be made to have a constant magnitude verses frequency response (termed an allpass response) by incorporating a feedforward section into the circuit. An efficient one multiplier form of the allpass form is shown in FIG. 3 [8,9]. The transfer function is given by $$X(z)=\frac{\mu+z^{-L}}{1+\mu z^{-L}} \quad (13)$$

The magnitude squared at $z=\exp(j\theta)$ is $$|X(e^{j\theta})|^2=\frac{1+\mu^2+2\cos(L\theta)}{1+\mu^2+2\cos(L\theta)} \quad (14)$$

which is unity, as required.

Figure 4:
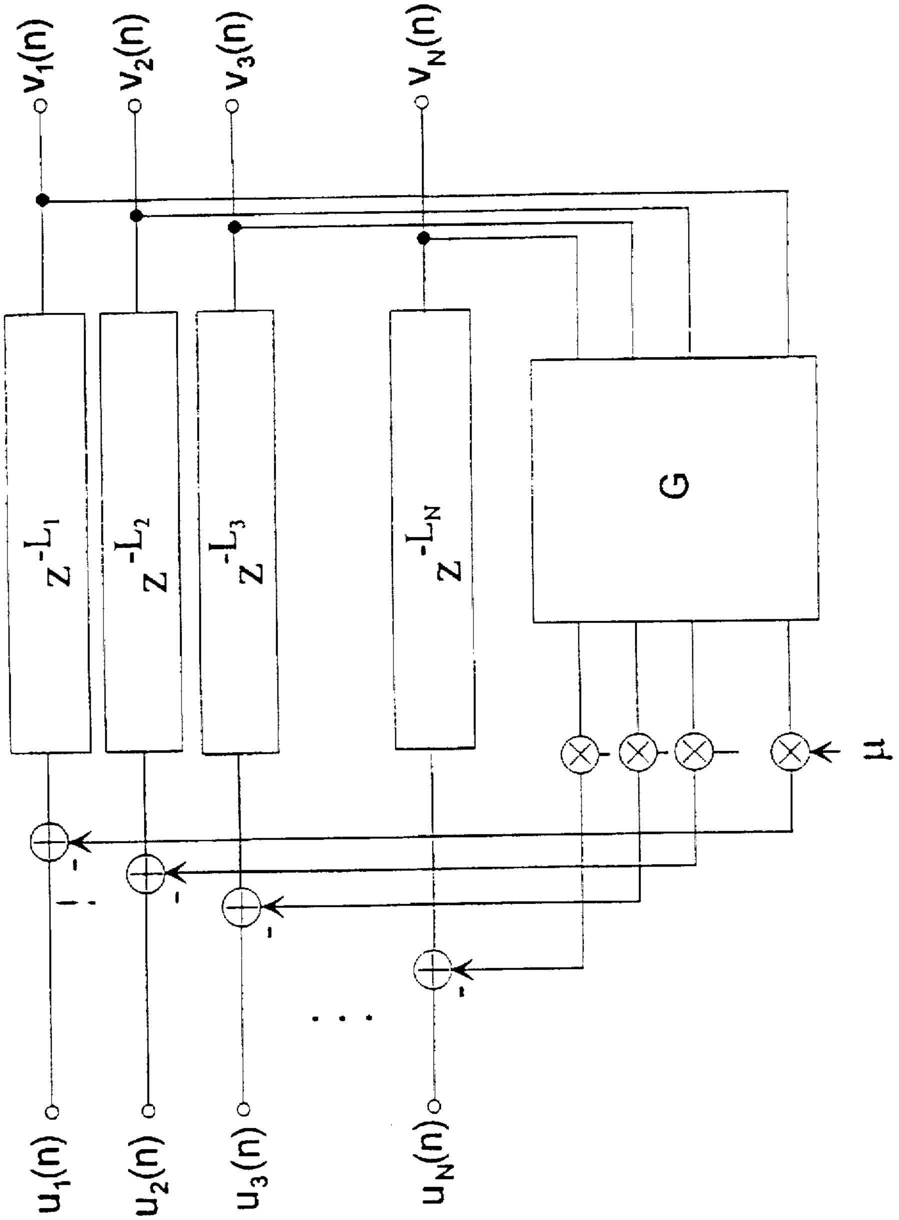
FIG. 4 shows a common structure for a conventional multi-channel reverberator.

Early forms of reverberator were constructed using a number of comb filters in parallel, with the summed outputs being fed into a number of allpass sections to increase the echo density [8]. A more recent structure for multichannel reverberators is as shown in FIG. 4 [9,10]. This structure is an extension of the single channel comb filter which achieves a high echo density by the cross coupling of a number of single channel comb filters, via the cross coupling matrix G. Subsequent allpass sections are not required. The response of the vector comb filter may be determined by assuming that the input is a vector of discrete signals $u_i(n)$ with a vector spectrum $$U(z)=[U_1(z),U_2(z),\ldots,U_N(z)]^T \quad (15)$$

The vector spectrum at the output of the adders is given by $$V.(z)=U(z)-GD(z)V.(z) \quad (16)$$

where D(z) is a diagonal delay matrix $$D(z)=\mathrm{diag}[z^{-L1},z^{-L1},\ldots z^{-LN}] \quad (17)$$

Solving for V+(z) allows the output vector spectrum V(z) to be found;

$$V(z)=D(Z)[I+\mu GD(z)]^{-1}U(z) \quad (18)$$

It can be shown [9, 10] that if the gain matrix G is orthonormal, ie $G^TG=I$, then the system is stable for $\mu<1$. The poles of the system are distributed in the z plane around a circle with radius less than unity.

Figure 5:
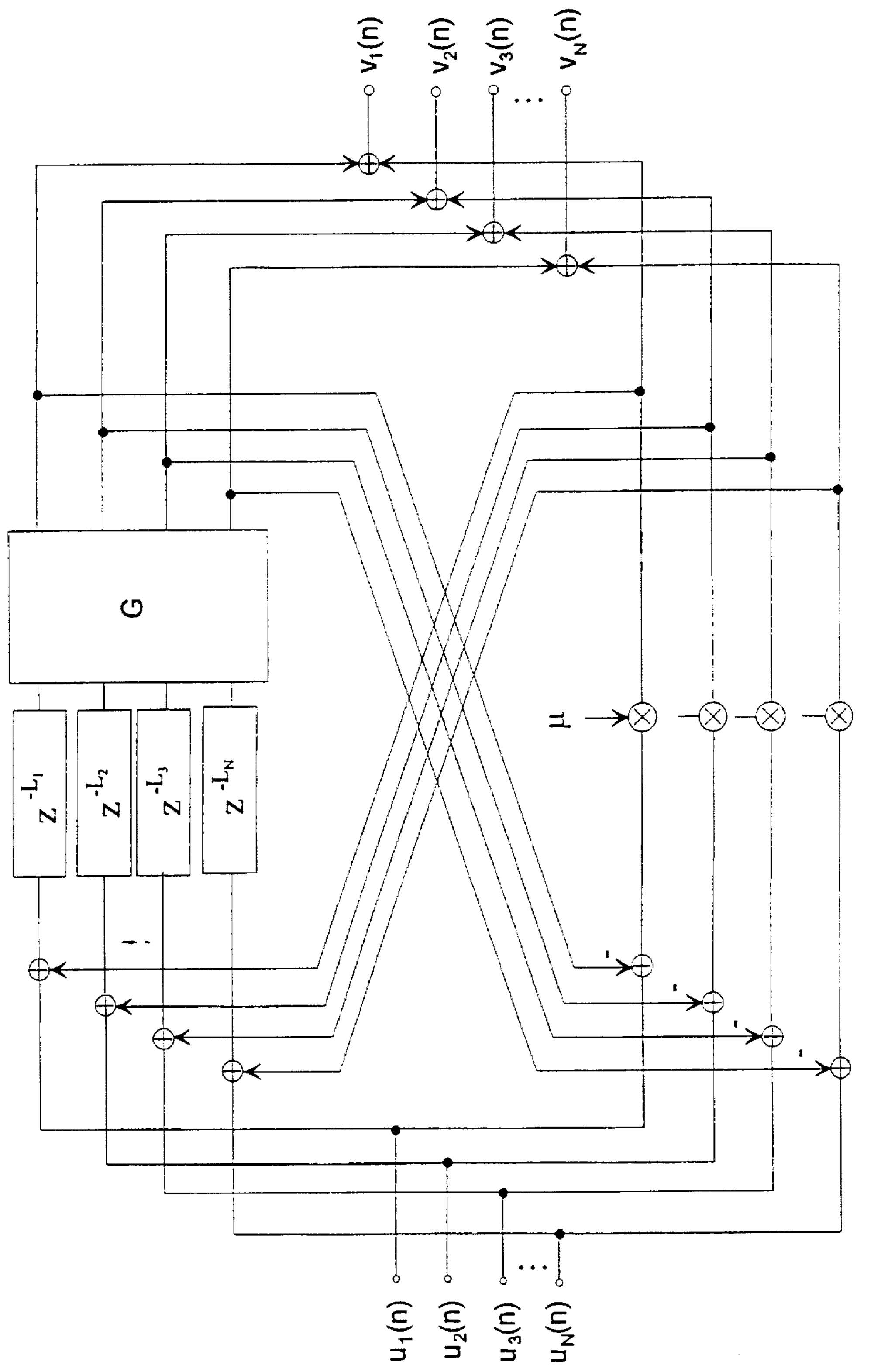
FIG. 5 shows a structure for an all pass vector comb filter reverberator system of the invention.

The multichannel reverberator circuit can be made to have allpass properties if a feedforward section is incorporated into the circuit, as in the one dimensional case. An efficient form with a single vector gain element (μ) and single cross coupling matrix G, is shown in FIG. 5. The output vector spectrum is given by $$V(z)=[\mu I+GD(z)][I+\mu GD(z)]^{-1}U(z) \quad (19)$$

The order of the gain and delay matrices may be reversed without altering the allpass properties of the circuit. It may be verified that the transfer function matrix in equation 19 is unitary at all frequencies as follows:

At any given frequency ω, the matrix transfer function has the form $$X=[\mu I+GD][I+\mu GD]^{-1} \quad (20)$$

where $D=\mathrm{diag}[\exp(j\phi_1),\exp(j\phi_2),\ldots,\exp(j\phi_N)]$. Now, the product GD is a unitary matrix since $$(GD)^{\dagger}(GD)=D^{\dagger}G^TGD=I \quad (21)$$

The eigenvalues decomposition of GD is thus $$GD=Q\Lambda Q^{\dagger} \quad (22)$$

where Q is a unitary matrix and Λ is a diagonal matrix of eigenvalues. Since GD is unitary the eigenvalues have unit magnitude, ie $$\Lambda=\mathrm{diag}[e^{j\alpha_1},e^{j\alpha_2},\ldots,e^{j\alpha_N}] \quad (23)$$

X may now be written $$\begin{aligned} X &= [\mu I+Q\Lambda Q^{\dagger}][I+\mu Q\Lambda Q^{\dagger}]^{-1} \\ &= [Q(\mu I+\Lambda)Q^{\dagger}][Q(I+\mu\Lambda)Q^{\dagger}]^{-1} \\ &= Q(\mu I+\Lambda)Q^{\dagger}Q(I+\mu\Lambda)^{-1}Q^{\dagger} \\ &= Q(\mu I+\Lambda)(I+\mu\Lambda)^{-1}Q^{\dagger} \\ &= QAQ^{\dagger} \end{aligned} \quad (24)$$

where A has the diagonal allpass form $$A=\mathrm{diag}\left[\frac{\mu+e^{j\alpha_1}}{1+\mu e^{j\alpha_1}},\frac{\mu+e^{j\alpha_2}}{1+\mu e^{j\alpha_2}},\ldots\frac{\mu+e^{j\alpha_N}}{1+\mu e^{j\alpha_N}}\right]. \quad (25)$$

We can now write $$\begin{aligned} X^{\dagger}X &= QA^{\dagger}Q^{\dagger}QAQ^{\dagger} \\ &= QA\cdot AQ^{\dagger} \\ &= I \end{aligned} \quad (26)$$

Hence the transfer function matrix X is unitary at all frequencies. The unitary system is formed from a set of N independent single dimensional allpass filters with a pre-coupling matrix $Q^{\dagger}(\omega)$ and a post coupling matrix $Q(\omega)$.

The foregoing describes the invention including preferred forms thereof. Alterations and modifications as will be obvious to those skilled in the art are intended to be incorporated in the scope hereof.

References

1) P. H. Parkin and K. Morgan, "Assisted Resonance in the Royal Festival Hall," *J. Acoust. Soc. Amer.*, vol. 48, pp 1025–1035, 1970

2) de Koning, S. H., "The MCR system-multiple channel amplification of reverberation," *Philips Tech. Rev.*, vol. 41, pp 12–23, 1983/84

3) A. Krokstad, Electroacoustic means of controlling auditorium acoustics, *Applied Acoustics* vol. 24, pp 275–288, 1988

4) NZ93/00041, "Wideband assisted reverberation system," Industrial Research Ltd, May 20, 1993

5) M. A. Poletti, "On controlling the apparent absorption and volume in assisted reverberation systems," *Acustica*, vol. 78, p 61–73, 1993

6) M. A. Poletti, "An improved assisted reverberation system," *Proceedings of the* 12th Biennial Conference of the New Zealand Acoustical Society, 2nd and 3rd September, 1993, pp 107–115

7) H. Kuttruff, Room Acoustics, Applied Science Publishers, 1973

8) M. R. Schroeder, "Natural sounding artificial reverberation," *J. Audio Eng. Soc.*, vol. 10, no. 3, pp 219–223, July 1962

9) J Jot, "Digital delay networks for designing artificial reverberators," 90*th convention of the Audio Engineering Society*, February 19–22, Paris 1991, preprint 3030

10) J Stautner and M. Puckette, "Designing multi channel reverberators," *Computer Music Journal*, vol. 6, no. 1, pp 52–65, 1982

I claim:

1. A multi-channel reverberation system comprising:

multiple signal inputs, one for each input channel;

a number of feed back comb filter networks connected one to each signal input, each comb filter network including a feed forward stage to provide a substantially constant multi-channel power gain at audio frequencies;

a cross-coupling network cross-coupling the comb filters to increase the reverberation echo density;

and multiple signal outputs, one for each output channel.

2. A multi-channel reverberation system according to claim 1, wherein the feed forward stage of the comb filters provides a transfer function matrix which is unitary at each frequency in the audio range.

3. A multi-channel reverberation system according to claim 1, wherein the cross-coupling matrix is an orthogonal cross-coupling matrix cross-coupling a number of single channel allpass comb filters, positioned immediately before or after the delay lines, to create a multi-channel allpass comb filter with a unitary transfer function matrix at all frequencies.

* * * * *

UNITED STATES PATENT AND TRADEMARK OFFICE
CERTIFICATE OF CORRECTION

PATENT NO : 5,729,613
DATED : March 17, 1998
INVENTOR(S) : Mark Poletti

It is certified that error appears in the above-identified patent and that said Letters Patent is hereby corrected as shown below:

At column 5, line 61 (equation 16), please delete "$V_+(z)=U(z)-GD(z)V_+(z)$" and insert in lieu thereof --$V_+(z)=U(z)-\mu GD(z)V_+(z)$--.

At column 5, line 65 (equation 17), please delete "$D(z)=diag[z^{-L1}, z^{-L1}, \ldots z^{-LN}$" and insert in lieu thereof -- $D(z)=diag[z^{-L1}, z^{-L2}, \ldots z^{-LN}$--.

At column 6, line 52 (equation 26), please delete "$= QA \bullet AQ^+$" and insert in lieu thereof --$= QA * AQ^+$--.

Signed and Sealed this

Twenty-third Day of June, 1998

Attest:

BRUCE LEHMAN

Attesting Officer

*Commissioner of Patents and Trademarks*